United States Patent [19]

La Rosa et al.

[11] 4,087,714
[45] May 2, 1978

[54] THREE PHASE UNIDIRECTIONAL TRANSDUCER

[75] Inventors: Richard La Rosa, South Hempstead, N.Y.; Gerald A. Aiello, Barboursville, Va.

[73] Assignee: Hazeltine Corporation, Greenlawn, N.Y.

[21] Appl. No.: 189,997

[22] Filed: Oct. 18, 1971

[51] Int. Cl.² ............................................. H01L 41/04
[52] U.S. Cl. .................................................. 310/313
[58] Field of Search ...................... 310/8, 8.1, 9.7, 9.8, 310/313; 333/30 R, 72

[56] References Cited

U.S. PATENT DOCUMENTS

| | | | |
|---|---|---|---|
| 3,243,648 | 3/1966 | Yando | 310/9.8 X |
| 3,401,360 | 9/1968 | Shulz-Du Bois | 310/9.8 X |
| 3,686,518 | 8/1972 | Hartmann et al. | 310/9.8 |

*Primary Examiner*—Mark O. Budd

[57] ABSTRACT

Disclosed is a multiterminal acoustic surface wave transducer which has a unidirectional response characteristic over a selected operating frequency band and is capable of launching and receiving surface waves in a body of piezoelectric material. In a specific embodiment the transducer includes a plurality of sets of first, second and third parallel electrodes arranged in cascade on a surface of the piezoelectric material with a center-to-center electrode spacing equal to one-third wavelength of a selected frequency within the frequency band. Corresponding electrodes in each set are interconnected, with each group of interconnected electrodes forming a terminal of what is in this case a three terminal transducer. When a three phase electrical signal is supplied to the terminals of the transducer with a 120° phase separation between terminals, the transducer will launch a corresponding surface wave in the piezoelectric material in the direction of phase progression among the electrodes. Since the transducer is reciprocal in nature it can also be used to receive an acoustic surface wave propagating in a body of piezoelectric material and supply a corresponding electrical signal to a three phase load.

15 Claims, 1 Drawing Figure

THREE PHASE UNIDIRECTIONAL TRANSDUCER

BACKGROUND OF THE INVENTION

This invention relates to acoustic surface wave apparatus and more particularly to a novel acoustic surface wave transducer capable of launching and receiving surface waves in a body of piezoelectric material with a unidirectional response characteristic.

Surface wave apparatus, as is well known in the art, generally consists of an acoustic surface wave propagation medium and one or more electromechanical transducers for launching and receiving surface waves into and from the medium. The most common type of transducer is called an interdigital transducer and consists of one or more sets of interleaved metal electrodes, deposited on the surface of the piezoelectric material with a spacing of ½ wavelength of the frequency at which the transducer is to operate. One finger from each pair is electrically interconnected by a first bus rail which forms a first terminal of the transducer and the remaining finger in each pair is electrically interconnected by a second bus rail which forms the second terminal of the transducer. When a single phase electrical signal is supplied to such a transducer the resulting surface wave can propagate in two directions. Such a transducer therefore has a minimum conversion loss of 3 db because half of the mechanical power is excited in each direction. Since this loss exists whether converting from an electrical signal to an acoustic surface wave or from an acoustic surface wave to an electrical signal the minimum net terminal loss for a two transducer acoustic surface wave apparatus is 6 db.

In the prior art it has been common to make terminations for the signal traveling in the wrong direction by using an absorbing material, such as wax or teflon, placed on the surface of the piezoelectric material to absorb the acoustic surface wave. This approach of course does not save any of the 6 db conversion loss.

A second approach to this problem, illustrated on page 1252 of the Proceedings of the IEEE, Vol. 58, No. 8, is to utilize as a launching transducer, two identical interdigital transducers separated by a distance $(n + \frac{1}{4})\lambda$ where $\lambda$ is the surface wave wavelength and $n$ is an integer. If these two transducers are supplied with electrical signals 90° out of phase they will each cause surface waves to propagate in the piezoelectric material, however, surface waves traveling in one direction will add in phase while those traveling in the opposite direction will cancel. This approach increases the overall transducer conversion efficiency by 3 db since the resulting surface wave propagates in only one direction, however, it has a serious disadvantage of a very narrow bandwidth due to the large spacing between the two transducers utilized to launch the surface wave.

SUMMARY OF THE INVENTION

The object of the invention therefore is to provide a multiterminal acoustic surface wave transducer having a unidirectional response characteristic and to provide such a transducer which is not limited to narrow bandwidths and is capable of being used in all types of surface wave apparatus such as delay lines, matched filters, and pulse compression and expansion filters.

In accordance with the invention there is provided a multiterminal acoustic surface wave transducer having a unidirectional response characteristic over a selected operating frequency band and capable of launching and receiving surface waves in a body of piezoelectric material. The invention includes a set of $n$ parallel electrodes (where $n$ is an integer greater than 2) arranged on a surface of the material with a center-to-center electrode spacing equal to $1/n$ wavelength of a selected frequency within the frequency band. Each of these electrodes forms a terminal of the multiterminal transducer. In this manner when an $n$ phase electrical signal is supplied to the terminals of the transducer with a $360°/n$ phase separation between terminals, the transducer will launch a corresponding surface wave in the material in the direction of phase progression among the electrodes.

For a better understanding of the present invention, together with other and further objects thereof, reference is had to the following description taken in connection with the accompanying drawings and its scope will be pointed out in the appended claims.

DESCRIPTION AND OPERATION OF THE INVENTION

Figure 1:
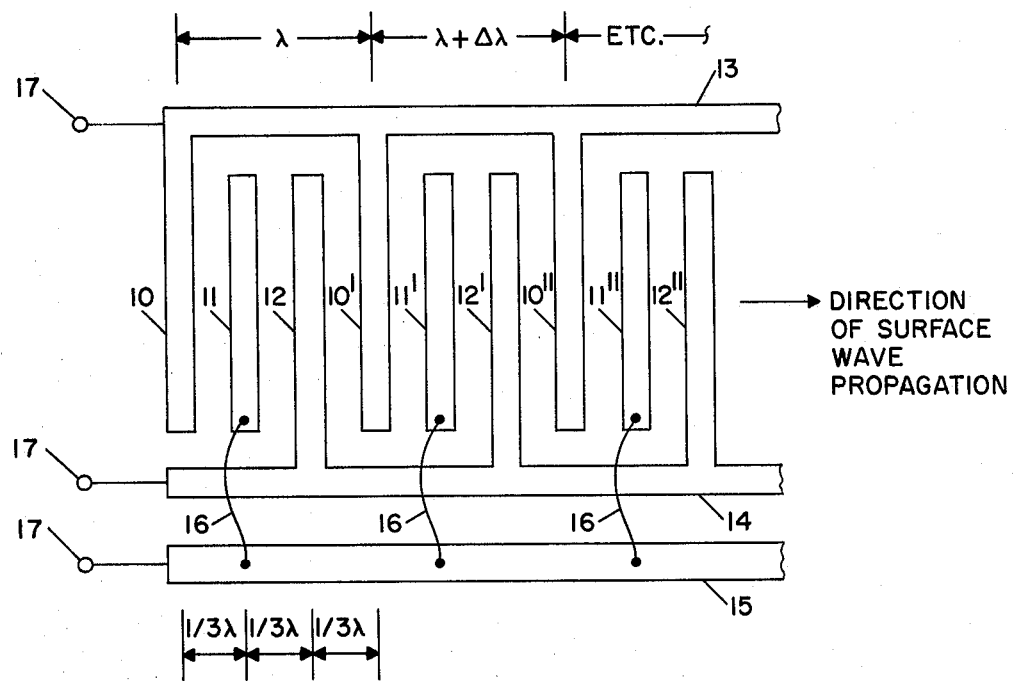
FIG. 1 illustrates a three terminal unidirectional acoustic surface wave transducer embodying the invention.

In order to provide an electro-mechanical transducer having a unidirectional response characteristic that is not limited by the prior art disadvantages the invention herein described employs multiterminal transducers which are responsive to multiphase signals. One of the advantages of such multiterminal transducers is that any technique commonly employed to construct conventional single phase transducers may be employed to build novel multiterminal unidirectional transducers. Another advantage of these unidirectional transducers is that they may be employed in any type of acoustic surface wave apparatus where it is desired to achieve unidirectionality, and the recitation hereinafter of specific uses for these transducers is solely to illustrate these novel aspects and not meant to limit the scope of the invention in any way.

Referring now to FIG. 1 there is shown a portion of a three phase unidirectional transducer embodying the invention. The transducer consists of a plurality of sets of three parallel electrodes arranged in cascade on the surface of a piezoelectric material (not shown). The first such set is numbered 10, 11 and 12, the second set 10', 11' and 12' and the third set 10'', 11'' and 12''. Other sets may, of course be included depending upon the particular use and type of operation desired for the transducer.

Each of these sets is made responsive to electrical signals of a selected frequency by arranging them to have a center-to-center electrode spacing equal to ⅓ wavelength ($\lambda$) of that frequency. In this manner the transducer can be constructed to have extremely broadband operation either by employing a relatively small number of sets, operative at the same frequency (in which case $\Delta\lambda$ shown in FIG. 1 would equal 0) or by utilizing a large number of sets each of which is operative at a progressively different frequency than the preceding set. In the latter case the frequency band over which the transducer is operative depends on $\Delta\lambda$ (which is the fractional increase or decrease in wavelength from one transducer to the next) and the number of sets employed. Thus, unlike the narrow band prior art transducers, extremely broad band operation can be obtained through the use of such multiterminal transducers and yet as hereinafter described unidirectionality can still be achieved.

Alternatively, a narrow band system can be constructed simply by setting Δλ equal to 0 and using a plurality of sets of electrodes. Since in this case each set is operative at the same frequency, the overall effect is to produce a narrow band transducer. Such a transducer still has advantages over the prior art narrow band device since the use of three (or more) terminal transducers eliminate re-reflections which normally occur in two terminal transducers.

In its simplest form the three terminal transducer may consist of a single set of electrodes 10, 11 and 12 in which case each electrode forms a terminal of the transducer, hence the name three terminal transducer. However, as previously stated, most transducers embodying the invention will consist of plurality of sets of such electrodes and therefore the invention also includes means for electrically interconnecting corresponding electrodes of each set with each group of interconnected electrodes forming a terminal of the three terminal transducer. In FIG. 1 the interconnecting means are illustrated by three conventional bus rails 13, 14 and 15 which are also arranged on the surface of the piezoelectric medium. In FIG. 1 bus rail 13 is used to interconnect all electrodes numbered 10 while bus rail 14 is used to interconnect all electrodes numbered 12 and bus rail 15 is used to connect all electrodes numbered 11. The particular configuration shown in FIG. 1 prevents bus rail 15 from being connected directly to its associated electrodes since the metallization connecting bus rails 13 and 14 to their electrodes provides an obstruction. Therefore bonding wires 16 are used to connect bus rail 15 to all electrodes 11. Of course the configuration illustrated at FIG. 1 is by no means critical and many variations will be apparent to those skilled in the art. For example, bonding wires may be eliminated by utilizing conventional insulated crossovers or by plating one bus rail on the reverse side of the piezoelectric medium and utilizing plated through holes to connect electrodes 11 to bus rail 15. Finally, each terminal (which consists of a bus rail and its associated electrodes) is connected to an electrical port 17 which may be used to accept or supply electrical signals for conversion into or from acoustic surface waves.

In operation the unidirectional transducer like all other surface wave transducers is reciprocal and therefore can be used to both launch and receive surface waves in a body of piezoelectric material. The following description however, will be confined to its function as a launching transducer for purposes of simplicity and clarity.

In order to launch a unidirectional surface wave in a body of piezoelectric material the electrical ports 17 of the FIG. 1 transducer are fed from a three-phase electrical signal source. (If this transducer were used to receive surface waves, ports 17 would be connected to a three-phase load such as a series of star connected resistors). In this manner the three bus rails 13, 14 and 15 will be supplied with identical electrical signals differing in phase by 120°. A surface wave will then be launched in the piezoelectric material only in the direction of phase progression among the electrodes. That is, if all electrodes 10 are supplied with the 0° signal component, all electrodes 11 with the 120° signal component and all electrodes 12 with the 240° signal component, a surface wave will only propagate in the direction indicated by the arrow in FIG. 1 (i.e. from left to right).

This can be seen by first referring only to one set of electrodes, for example numbers 10, 11 and 12. Since these electrodes are spaced at ⅓ wavelength of the frequency at which the transducer is designed to operate, the phase of a signal launched by any one of them will change by 120° by the time that signal reaches the next electrode. For example the phase of the signal launched by electrode 10 will change by 120° when that signal reaches electrode 11. Furthermore the phase of the signal launched by electrode 10 will change by 240° by the time it reaches electrode 12 and the phase of the signal launched by electrode 11 will change by 120° by the time it reaches electrode 12. In the direction of phase progression of the electrodes (left to right) these changes in phase in the propagated signal correspond exactly to the changes in phase of the electrical signals supplied to each of the electrodes and therefore when the propagated signal traveling in this direction encounters each electrode it is reinforced. On the other hand the wave which would normally propagate in the opposite direction does not arrive at each of the electrodes in phase with the signal being launched by that electrode and therefore tends to be canceled. The additional sets of electrodes (10′, 11′ and 12′, etc.) function in the same manner thus achieving unidirectional operation from the transducers with the corresponding saving in electromechanical conversion loss of 3 db.

Another feature of multiterminal unidirectional transducers is that when used as a receiver they eliminate reflections since the entire surface wave is absorbed by the transducer. Conventional transducers reflect ¼ of the incident power.

It will be apparent that the invention is not limited to a three terminal transducer but in fact may be constructed with four or more terminals. To construct a transducer having more than three terminals a set of $n$ parallel electrodes (where $n$ is an integer greater than 2) would be arranged on the surface of the piezoelectric material with a center-to-center electrode spacing equal to $1/n$ wavelength of a selected frequency within the operating frequency band. If a plurality of such sets were used, just as in the three terminal transducer, means for interconnecting corresponding electrodes in each set must also be provided so as to form terminals for the transducer. In this manner when an $n$ phase electrical signal is supplied to these terminals with a $360°/n$ phase separation between terminals the transducer will launch a corresponding surface wave in the material in the direction of phase progression among the electrodes. For example, if a four terminal transducer were to be constructed it would utilize one or more sets of four parallel electrodes arranged on the surface of the piezoelectric material with a center-to-center electrode spacing of ¼ wavelength of the selected frequency. Corresponding electrodes in each set would be interconnected through the use of bus rails and the bonding wire technique described in connection with FIG. 1 for example, thus forming a four terminal transducer. This transducer would then be supplied with a four phase electrical signal consisting of signal components having phases of 0°, 90°, 180°, and 270° causing a unidirectional surface wave to propagate in the piezoelectric material in the direction of phase progression among the electrodes.

As previously stated unidirectional transducers have widespread application and may be used in any surface wave apparatus that presently utilizes bidirectional transducers, however, one configuration that is particularly useful is that of a pulse compression or expansion filter. In this configuration each of a plurality of sets of electrodes is responsive to a progressively different frequency within an operating frequency band. When a suitable electrical signal having various frequency components is supplied to such transducer each frequency component is launched in the piezoelectric material by a corresponding different one of said sets thus providing a surface wave which has different frequency components of the original signal time delayed by different amounts. This, of course, is a pulse expansion filter and could easily be used as a pulse compression filter simply by using the transducer to receive an expanded surface wave.

A three terminal unidirectional transducer useful in a filter of the type described above was successfully constructed and operated at 30 MHz with a 6 MHz bandwidth. The transducer utilized six sets of gold electrodes interconnected by 3 bus rails. One bus rail utilized 0.7 mil gold bonding wires to connect it to its electrodes. The electrodes were approximately 1/6 wavelength wide and several wavelengths long. While the width of the electrodes is not critical it is desirable to have the length substantially greater than the width so as to prevent distortion from occurring in the propagating surface wave. This transducer achieved the expected 3 db savings in insertion loss over a conventional transducer.

While there have been described what is at present considered to be the preferred embodiment of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A multiterminal acoustic surface wave transducer having a unidirectional response characteristic over a selected operating frequency band and capable of launching and receiving surface waves in a body of piezoelectric material, comprising:
   a set of n parallel electrodes (where n is an integer greater than 2) arranged on one surface of said material with a center-to-center electrode spacing equal to 1/n wavelength of a selected frequency within said frequency band, each electrode forming a terminal of said multiterminal transducer;
   means for supplying an n phase electrical signal to the terminals of said transducer with a 360°/n phase separation between terminals, thereby causing said transducer to launch a corresponding surface wave in said material in the direction of phase progression among said electrodes.

2. A transducer in accordance with claim 1 comprising a plurality of sets of electrodes arranged in cascade on the surface of said piezoelectric material, each set having a center-to-center electrode spacing equal to 1/n wavelength of a selected frequency in said frequency band;
   and means for electrically interconnecting corresponding electrodes of each set, each group of interconnected electrodes forming a terminal of said multiterminal transducer.

3. Apparatus in accordance with claim 2 wherein n equals 3.

4. A three terminal acoustic surface wave transducer having a unidirectional response characteristic over a selected operating frequency band and capable of launching and receiving surface waves in a body of piezoelectric material, comprising:
   a plurality of sets of first, second and third parallel electrodes arranged in cascade on one surface of said material with a center-to-center electrode spacing equal to ⅓ wavelength at a selected frequency within said frequency band;
   means including first, second and third bus rails arranged on a surface of said material, for electrically interconnecting corresponding electrode of each set, each group of interconnected electrodes forming a terminal of said three terminal transducer;
   and means for supplying a three-phase electrical signal to the terminals of said transducer with a 120° phase separation between terminals, thereby causing said transducer to launch a corresponding surface wave in said material in the direction of phase progression among said electrodes.

5. A transducer in accordance with claim 4 in which each set of said electrodes is operative at a frequency within said frequency band which is progressively different than the set before it;
   whereby when said three phase signal is applied to said terminals, different sets of electrodes will launch different frequency components of said signal causing a time expanded surface wave to flow in said piezoelectric material.

6. A transducer in accordance with claim 4 wherein two of said bus rails are connected directly to their associated electrodes and the third bus rail is connected to each of its associated electrodes through bonding wires.

7. A transducer in accordance with claim 4 wherein each electrode has a width of approximately 1/6 wavelength of said selected frequency.

8. A multiterminal acoustic surface wave transducer having a unidirectional response characteristic over a selected operating frequency band and capable of launching and receiving surface waves in a body of piezoelectric material, comprising:
   a plurality of sets of three electrodes arranged on one surface of said material with a spacing of one-third wavelength of a selected frequency within said frequency band, each electrode forming a terminal of said multiterminal transducer;
   means for supplying an n phase electrical signal to the terminals of said transducer with a preselected different phase separation between terminals, thereby causing said transducer to launch a corresponding surface wave in said material in the direction of phase progression among said electrodes.

9. A unidirectional interdigitated surface wave transducer having a preselected response frequency comprising:
   a. a piezoelectric substrate;
   b. a first array of substantially parallel electrodes defined on one surface of said substrate;
   c. a second array of substantially parallel electrodes defined on said one surface interleaved with said first array of electrodes;
   d. a third array of substantially parallel electrodes defined on said one surface interleaved with said first and second arrays of electrodes, said first, second and third arrays of electrodes respectively having a periodicity corresponding to one acoustic wavelength of the resonance frequency of said transducer; and e. means for simultaneously applying voltages or a preselected different phase to each array of electrodes to generate driving electric fields of different phases between sequential pairs of adjacent electrodes, whereby the acoustic wave generated in the surface of said substrate propagates unidirectionally.

10. A unidirectional transducer as set forth in claim 9 wherein the voltages applied to the respective arrays are mutually out of phase by 120°.

11. A unidirectional interdigitated surface wave transducer having a preselected resonance frequency comprising:

a. a piezoelectric substrate;

b. a first array of substantially parallel elongated electrodes defined on one surface of said substrate;

c. a second array of substantially parallel elongated electrodes defined on said one surface interleaved with said first array of electrodes;

d. a third array of substantially parallel elongated electrodes defined on said one surface interleaved with said first and second arrays of electrodes, said first, second and third arrays of electrodes respectively having a periodicity corresponding to one acoustic wavelength of the resonance frequency of said transducer, successive electrodes of said interleaved arrays of electrodes being substantially equidistantly spaced apart by one-third of said acoustic wavelength; and e. means for simultaneously applying a voltage of different phase to each of said arrays, to generate driving electric fields of different phases between sequential pairs of adjacent electrodes, the phase difference between the voltage applied to respective arrays being substantially 120°.

12. In an acoustic-wave transmitting device having an acoustic-wave-propagating medium, a first transducer responsive to input signals for launching along a predetermined path in said medium desired acoustic surface waves exhibiting a predetermined wavelength and a second transducer responsive to said desired acoustic waves for developing output signals and also responsive to spurious acoustic-surface waves also of said wavelength in said medium for developing undesired output signal components, the improvement in at least one of said transducers comprising:

an iterative series of conductive ribbons individually disposed across said path and laterally spaced one from the next by a center-to-center distance of one-fourth said predetermined wavelength;

means for coupling said first signal components exclusively across one of a first pair of successive ribbons and one of an adjacent pair of successive ribbons with the center-to-center distance between said pairs being one-half said predetermined wavelength;

and means for coupling second signal components exclusively across the other of said ribbons in said first and second pairs with the center-to-center distance between said other ribbons also being one-half said predetermined wavelength.

13. A device as defined in claim 12 in which said first-signal-component coupling means includes a first load coupled across said one ribbons, and said second-signal-component coupled means includes a second load coupled across said other ribbons.

14. A device as defined in claim 13 which further comprises means, including means for shifting the phase of one of said first and second signal components by $\pi/2$ radians, for combining the signals in said first and second loads.

15. A device as defined in claim 12 in which said first-signal-component coupling means includes a first source of signals of predetermined frequency coupled across said one ribbons, and said second-signal-component coupling means includes a second source of signals, also of said predetermined frequency but shifted in phase by $\pi/2$ radians relative to the signals from said first source, coupled across said other ribbons.

* * * * *